United States Patent
Ko et al.

(10) Patent No.: US 7,630,270 B2
(45) Date of Patent: Dec. 8, 2009

(54) DUAL MODE SRAM ARCHITECTURE FOR VOLTAGE SCALING AND POWER MANAGEMENT

(75) Inventors: Uming Ko, Plano, TX (US); Gordon Gammie, Plano, TX (US); Sumanth K. Gururajarao, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/841,310

(22) Filed: Aug. 20, 2007

(65) Prior Publication Data

US 2008/0043560 A1    Feb. 21, 2008

Related U.S. Application Data

(60) Provisional application No. 60/823,021, filed on Aug. 21, 2006.

(51) Int. Cl.
*G11C 5/14* (2006.01)
(52) U.S. Cl. .................. 365/227; 365/226; 365/229
(58) Field of Classification Search ............. 365/226, 365/227, 228, 229
See application file for complete search history.

(56) References Cited

U.S. PATENT DOCUMENTS 6,166,991 A * 12/2000 Phelan .............. 365/233.15
6,657,887 B2 * 12/2003 Higeta et al. ............. 365/156
7,039,818 B2    5/2006 Deng et al.
2004/0141362 A1 *  7/2004 Sumitani et al. ........... 365/154
2004/0143769 A1 *  7/2004 Deng et al. ................ 713/300
2005/0036385 A1 *  2/2005 Deng et al. ................ 365/222
2005/0047233 A1 *  3/2005 Deng ........................ 365/204
2005/0094474 A1 *  5/2005 Deng et al. ................ 365/229
2006/0206739 A1 *  9/2006 Kim et al. .................. 713/322

OTHER PUBLICATIONS

Hugh McIntyre et al.; "A 4-MB On-Chip L2 Cache for a 90-nm 1.6-GHz 64-bit Microprocessor"; Jan. 2005; IEEE Journal of Solid-State Circuits, vol. 40, No. 1; pp. 52-59.*
John P. Uyemura; "Circuit Design for CMOS VLSI"; 1992, Kluwer Academic Publishers; pp. 81 and 186-187.*
Evert Seevinck; "Static-Noise Margin Analysis of MOS SRAM Cells"; Oct. 1987; IEE Journal of Solid-State Circuits, vol. SC-22, No. 5; pp. 748-754.*
Mair, et al; "Systems and Methods for Managing Power"; U.S. Appl. No. 11/637,352, filed Dec. 12, 2006.

* cited by examiner

*Primary Examiner*—Hoai V Ho
*Assistant Examiner*—Jay Radke
(74) *Attorney, Agent, or Firm*—Wade J. Brady, III; Frederick J. Telecky, Jr.

(57) ABSTRACT

The present disclosure provides a dual-mode voltage controller, a method of supplying voltage to SRAM periphery circuits and an integrated circuit. In one embodiment, the dual-mode voltage controller is for use with an SRAM array and includes a voltage switching unit connected to a digital core voltage and an SRAM array voltage to form a structure capable of switching at least one SRAM periphery circuit between the digital core voltage and the SRAM array voltage.

12 Claims, 1 Drawing Sheet

DUAL MODE SRAM ARCHITECTURE FOR VOLTAGE SCALING AND POWER MANAGEMENT

CROSS-REFERENCE TO PROVISIONAL APPLICATION

This application claims the benefit of U.S. Provisional Application No. 60/823,021 entitled "Dual Mode SRAM Architecture for Voltage Scaling and Power Reduction" to Uming Ko, Gordon Gammie and Sumanth K. Gururajarao, filed on Aug. 21, 2006, which is incorporated herein by reference in its entirety.

TECHNICAL FIELD OF THE INVENTION

The present disclosure is directed, in general, to integrated circuits and, more specifically, to an SRAM array having periphery circuits that is employed with a digital core.

BACKGROUND OF THE INVENTION

The trend in portable electronic devices is towards smaller physical sizes using wireless communications and multimedia processing. This requires increased computing power to supply the feature-rich functionality needed. Unfortunately, progress in battery power capacity is not growing as rapidly as these technologies require for their support. Therefore, intelligent power management in these applications is an important factor for successful implementations.

CMOS circuits often play a dominant role in these devices, which are usually integrated to the point of having a system on a chip (SoC). The power dissipated in CMOS circuits consists of two major components. One component is proportional to the product of supply voltages and their static currents provided. The other component is proportional to the product of the square of supply voltages, the capacitance being switched, a switching activity factor based on the probability of a particular operation and the frequency of operation.

Dynamic Voltage/Frequency Scaling (DVFS) reduces one or more supply voltages while slowing the operating frequency to provide a quadratic reduction in energy consumption at the cost of increased operation time. The operation frequency can be adjusted dynamically to meet the minimum performance requirements of the application. Correspondingly, the operation voltage can also be adjusted dynamically to minimize wasted power consumption based on meeting the minimum performance requirements. These reductions are targeted to provide a "just-in-time" performance for the application.

The application of current voltage and frequency management techniques allows more efficient operation of electronic devices. However, improvements in power management techniques would prove beneficial in the art.

SUMMARY OF THE INVENTION

The present disclosure provides a dual-mode voltage controller, a method of supplying voltage to SRAM periphery circuits and an integrated circuit. In one embodiment, the dual-mode voltage controller is for use with an SRAM array and includes a voltage switching unit connected to a digital core voltage and an SRAM array voltage to form a structure capable of switching at least one SRAM periphery circuit between the digital core voltage and the SRAM array voltage.

In another aspect, the present disclosure provides a method of supplying voltage to SRAM periphery circuits. The method includes providing a digital core voltage and an SRAM array voltage and switching at least one SRAM periphery circuit between the digital core voltage and the SRAM array voltage.

The present disclosure also provides, in yet another aspect, an integrated circuit. The integrated circuit includes a digital core along with an SRAM array that is coupled to the digital core and employs a plurality of SRAM periphery circuits. The integrated circuit also includes a dual-mode voltage controller having a voltage switching unit that is connected to a digital core voltage and an SRAM array voltage to form a structure capable of switching at least one SRAM periphery circuit between the digital core voltage and the SRAM array voltage. The integrated circuit further includes a control unit that controls the switching of the at least one SRAM periphery circuit based on a scaled value of the digital core voltage.

BRIEF DESCRIPTION OF THE DRAWINGS

For a more complete understanding of the present disclosure, reference is now made to the following descriptions taken in conjunction with the accompanying drawings, in which.

DETAILED DESCRIPTION

Embodiments of the present disclosure provide the ability to more effectively control power management between two groups of circuits or systems having conflicting requirements associated with their primary supply voltages. This may be accomplished while providing efficient energy conservation through control of determining where and when a portion of a more voltage-sensitive circuit or system receives its primary supply voltage based on a required performance.

Static noise margin may be considered a key figure of merit of SRAM cell and array robustness. A "butterfly curve" is a two-lobed curve that plots a voltage transfer characteristic of a first inverter of the SRAM cell against an inverse voltage transfer characteristic of a second inverter of the SRAM cell. The static noise margin may be defined as the length of the side of the largest square that fits between the two lobes of the butterfly curve. As the supply voltage of the SRAM array decreases, the area between the two lobes of the butterfly curve also decreases thereby reducing the value of the static noise margin of the cell. Although the static noise margin is important during a hold mode of the SRAM cell, stability of the cell during active operation may represent a more significant limitation to proper functioning of SRAM arrays.

Figure 1:
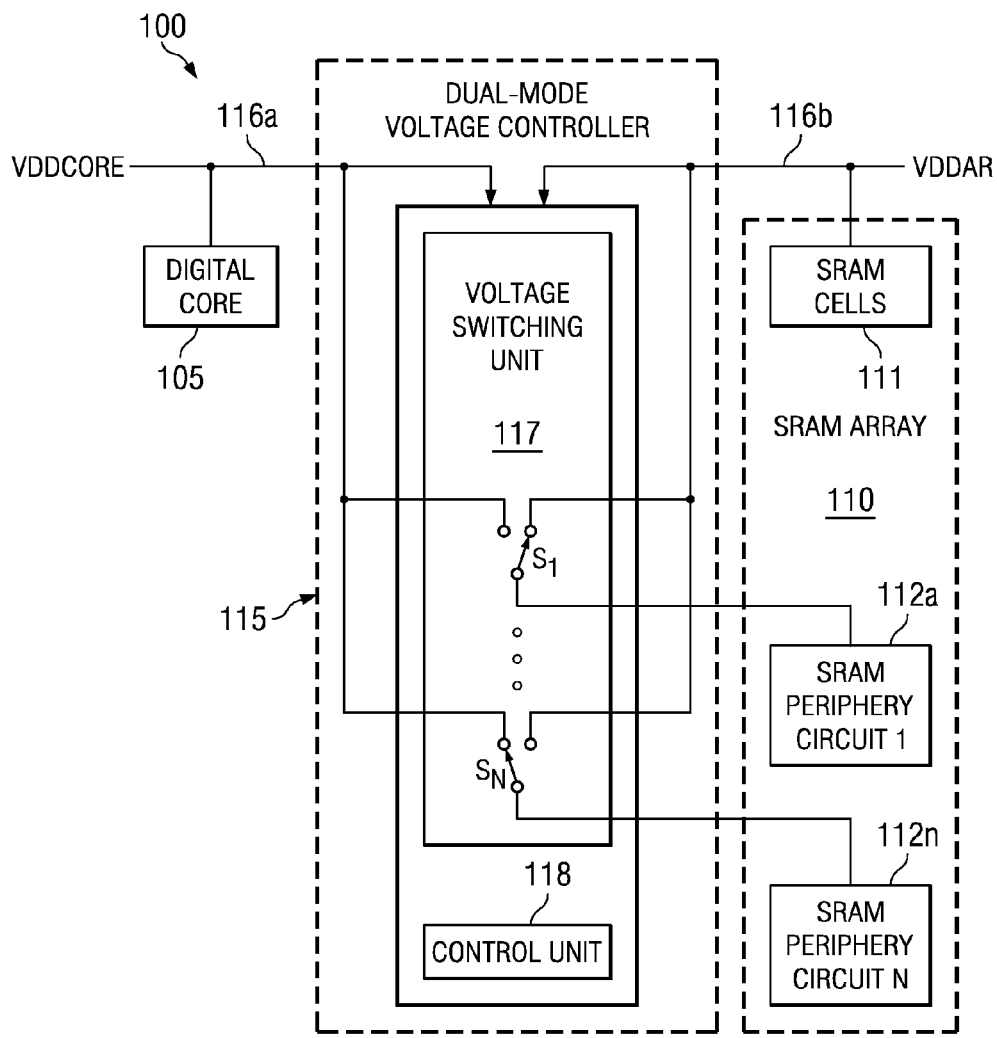
FIG. 1 illustrates a system diagram of an integrated circuit 100 as provided by one embodiment of the disclosure.

FIG. 1 illustrates a system diagram of an integrated circuit 100 as provided by one embodiment of the disclosure. The integrated circuit 100 includes a digital core 105, an SRAM array 110 and a dual-mode voltage controller 115 that is coupled to a digital core voltage bus 116a and an SRAM array voltage bus 116b that form a split-rail SRAM voltage bus, in the illustrated embodiment. The SRAM array 110 includes a plurality of SRAM cells 111 that provides a memory and a corresponding plurality of SRAM periphery circuits 112a-112n that coordinates operation of the memory. The dual-mode voltage controller 115 includes a voltage switching unit 117 and a control unit 118.

The digital core voltage bus 116a provides a digital core voltage $V_{DDCORE}$ and the SRAM array voltage bus 116b provides an SRAM array voltage $V_{DDAR}$. The voltage switching unit 117 is connected to the digital core voltage $V_{DDCORE}$ and the SRAM array voltage $V_{DDAR}$ to form a structure that switches at least one SRAM periphery circuit between the digital core voltage $V_{DDCORE}$ and the SRAM array voltage $V_{DDAR}$. The control unit 118 controls the switching of the at least one SRAM periphery circuit based on a scaled value of the digital core voltage $V_{DDCORE}$.

The digital core 105 may be any of a set of standard or custom portions of digital circuits or sub-systems, such as a digital signal processor (DSP), and may use a general digital library to implement a design solution. The digital core 105 often requires significant real estate provided by a system on a chip and therefore a significant portion of the power expended by the integrated circuit 100. The SRAM array 110 provides memory for the digital core 105. Scaling of the digital core voltage $V_{DDCORE}$ thereby provides most of the power savings for the integrated circuit 100.

The SRAM cells 111 of the SRAM array 110 are always connected to the SRAM array voltage $V_{DDAR}$, as shown. Although the SRAM array voltage $V_{DDAR}$ may also be scaled in some embodiments, its scaled voltage values are always sufficient to assure that a predetermined, static noise margin figure of merit for the SRAM array 110 is maintained. If the SRAM array voltage $V_{DDAR}$ is scaled, it may be scaled independently of or concurrently with the digital core voltage $V_{DDCORE}$.

Additionally, switching each of the SRAM periphery circuits 112a-112n is also based on maintaining the predetermined, static noise margin figure of merit for the SRAM array 110. In the illustrated embodiment, the predetermined, static noise margin figure of merit is at least five. Of course, other static noise margin figures of merit may be chosen as appropriate to a particular application. Any SRAM periphery circuit typically may be switched wherein examples include an SRAM bit-line pre-charge circuit, an SRAM timing circuit, an SRAM read circuit and an SRAM write circuit.

The voltage switching unit 117 includes a plurality of switches $S_1$-$S_N$ wherein each corresponds to one of the plurality of SRAM periphery circuits 112a-112n, as shown. The switches $S_1$-$S_N$ (shown in representative form in FIG. 1) can operate independently of each other under the direction of the control unit 118. When the digital core voltage $V_{DDCORE}$ is at its highest value, all of the switches $S_1$-$S_N$ are positioned to connect the plurality of SRAM periphery circuits 112a-112n to the digital core voltage bus 116a. As the digital core voltage $V_{DDCORE}$ is scaled downward to its lowest voltage, all of the switches $S_1$-$S_N$ are positioned to connect the plurality of SRAM periphery circuits 112a-112n to the SRAM array voltage $V_{DDAR}$.

In one embodiment, the control unit 118 monitors the digital core voltage $V_{DDCORE}$ for a voltage value, as the digital core voltage $V_{DDCORE}$ is being scaled, to determine voltage switching points for each of the plurality of SRAM periphery circuits 112a-112n. In an alternative embodiment, the control unit 118 provides a control signal (not shown in FIG. 1) that determines the digital core voltage value provided. This voltage value may also be selected from a set of predefined digital core voltages. In some applications, these voltage values may be dependent on and therefore tailored to a particular die's unique performance. Alternatively, they may be dependent on a fabrication process, a particular supply voltage employed or ambient and operating temperatures encountered (i.e., PVT parameters).

In these cases, the voltage value of the digital core voltage $V_{DDCORE}$ further determines a switch position for each of the switches $S_1$-$S_N$. These switch positions thereby determine which of the plurality of SRAM periphery circuits 112a-112n is connected to the digital core voltage $V_{DDCORE}$ or to the SRAM array voltage $V_{DDAR}$.

Therefore, embodiments of the present disclosure allow the digital core voltage $V_{DDCORE}$ to be scaled farther downward than would otherwise be allowed if the involved SRAM periphery circuits were permanently connected to it. Correspondingly, a greater power savings is obtained for the integrated circuit 100 by initially allowing the supply voltage of involved SRAM periphery circuits to be provided by the digital core voltage $V_{DDCORE}$ as it is scaled downward. Additionally, an enhanced power management is provided by switching the involved SRAM periphery circuits between the digital core voltage $V_{DDCORE}$ and the SRAM array voltage $V_{DDAR}$ as the voltage scaling progresses downward or upward based on the required performance characteristics for the integrated circuit 100.

Figure 2:
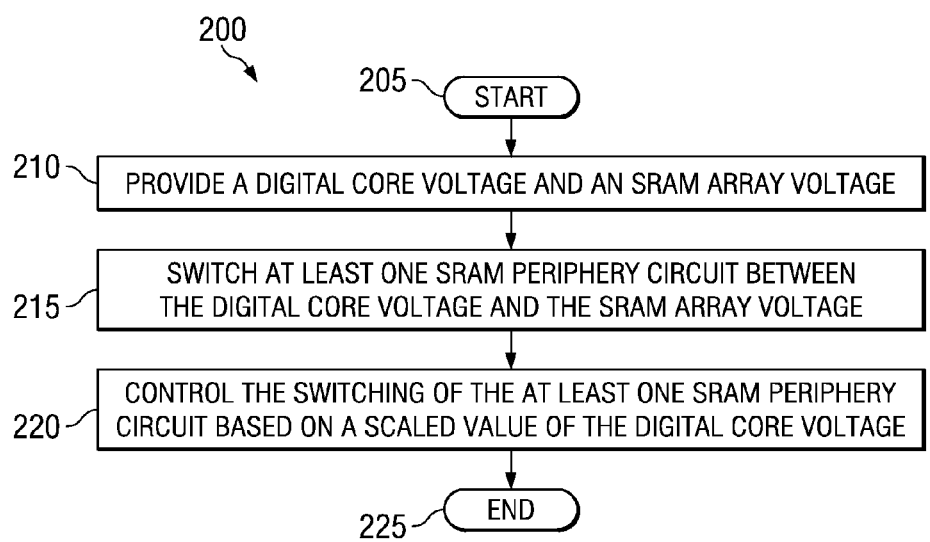
FIG. 2 illustrates a flow diagram of a method 200 as provided by one embodiment of the disclosure.

FIG. 2 illustrates a flow diagram of a method 200 as provided by one embodiment of the disclosure. The method 200 is for use in supplying voltage to at least a portion of SRAM periphery circuits and starts in a step 205. Then, a digital core voltage and an SRAM array voltage are provided in a step 210. In one embodiment, the digital core and SRAM array voltages are provided by a split-rail SRAM voltage bus structure wherein a digital core employs the digital core voltage and at least a portion of an SRAM array employs the SRAM array voltage. The digital core voltage is scaled downward (i.e., reduced in voltage value) corresponding to reduced performance requirements associated with the digital core to provide savings in power from a digital core voltage supply.

In a preferred embodiment, a set of periphery circuits that are part of the SRAM array and support its operation are initially connected to the digital core voltage, while it is being scaled downward, to enhance overall power savings. The periphery circuits may include an SRAM bit-line pre-charge circuit, an SRAM timing circuit, an SRAM read circuit or an SRAM write circuit. Other periphery circuits or portions of periphery circuits may also be included.

In one embodiment, only the digital core voltage is scaled while the SRAM array voltage is maintained at a value that assures an adequate static noise margin figure of merit for SRAM cells of the SRAM array. Maintaining a static noise margin figure of merit of at least five is typically adequate and provided by one embodiment. In another embodiment, the SRAM array voltage may also be scaled downward with the digital core voltage to a voltage value that preserves a selected minimum static noise margin figure of merit. Alternatively, the SRAM array voltage and the digital core voltage may be scaled independently.

In a step 215, at least one SRAM periphery circuit is switched between the digital core voltage and the SRAM array voltage. Generally, one or more of the SRAM periphery circuits may be switched from the digital core voltage to the SRAM array voltage or from SRAM array voltage to the digital core voltage. The direction of this switching is based on the value of the digital core voltage and a corresponding value of the static noise margin figure of merit for the SRAM array afforded by its voltage value.

In a step 220, control of the switching of one or more of the SRAM periphery circuits from the digital core voltage to the SRAM array voltage occurs at a scaled-down digital core voltage value needed to maintain an adequate static noise margin figure of merit for the SRAM array. Correspondingly, at least one SRAM periphery circuit may then be switched back from the SRAM array voltage to the digital core voltage as its voltage value is scaled upward and again provides an adequate static noise margin figure of merit for the SRAM array. In one embodiment, the scaled voltage value for switching is selected from a set of predefined digital core voltages that correlates to a set of SRAM periphery circuits. The method ends in a step 225.

In summary, embodiments of the present disclosure employing a dual-mode voltage controller, a method of supplying voltage to SRAM periphery circuits and an integrated circuit employing the controller or the method have been presented. Advantages include enabling reduced power from an SRAM array voltage supply, especially when operating at higher voltages and speeds, by employing another supply voltage for at least a portion of the SRAM periphery circuits. However, a balance in overall voltage supply usage is obtained by overcoming a low voltage limitation of a SRAM array that would otherwise prevent the other supply voltage, such as a digital core voltage, from being scaled downward to the extent possible.

Those skilled in the art to which the disclosure relates will appreciate that other and further additions, deletions, substitutions and modifications may be made to the described example embodiments without departing from the disclosure.

What is claimed is:

1. A dual-mode voltage controller for use with an SRAM array, comprising:
   a voltage switching unit connected to a digital core voltage and an SRAM array voltage to form a structure capable of switching at least one SRAM periphery circuit between the digital core voltage and the SRAM array voltage; and
   a control unit configured to control the switching of the at least one SRAM periphery circuit based on a scaled value of the digital core voltage, wherein the scaled value is selected from a set of predefined digital core voltages corresponding to a set of SRAM periphery circuits.

2. The controller as recited in claim 1 wherein the at least one SRAM periphery circuit is selected from the group consisting of:
   an SRAM bit-line pre-charge circuit;
   an SRAM timing circuit;
   an SRAM read circuit; and
   an SRAM write circuit.

3. The controller as recited in claim 1 wherein switching the at least one SRAM periphery circuit is based on maintaining a static noise margin figure of merit for the SRAM array.

4. The controller as recited in claim 1 wherein the digital core voltage is scaled independently of the SRAM array voltage.

5. A method of supplying voltage to SRAM periphery circuits, comprising:
   providing a digital core voltage and an SRAM array voltage;
   switching at least one SRAM periphery circuit between the digital core voltage and the SRAM array voltage; and
   controlling the switching of the at least one SRAM periphery circuit based on a scaled value of the digital core voltage, wherein the scaled value is selected from a set of predefined digital core voltages corresponding to a set of SRAM periphery circuits.

6. The method as recited in claim 5 wherein the at least one SRAM periphery circuit is selected from the group consisting of:
   an SRAM bit-line pre-charge circuit;
   an SRAM timing circuit;
   an SRAM read circuit; and
   an SRAM write circuit.

7. The method as recited in claim 5 wherein switching the at least one SRAM periphery circuit is based on maintaining a static noise margin figure of merit for the SRAM array.

8. The method as recited in claim 5 wherein the digital core voltage is scaled independently of the SRAM array voltage.

9. An integrated circuit, comprising:
   a digital core;
   an SRAM array that is coupled to the digital core and employs a plurality of SRAM periphery circuits; and
   a dual-mode voltage controller, including:
   a voltage switching unit that is connected to a digital core voltage and an SRAM array voltage to form a structure capable of switching at least one SRAM periphery circuit between the digital core voltage and the SRAM array voltage; and
   a control unit that controls the switching of the at least one SRAM periphery circuit based on a scaled value of the digital core voltage, wherein the scaled value is selected from a set of predefined digital core voltages corresponding to a set of SRAM periphery circuits.

10. The integrated circuit as recited in claim 9 wherein the at least one SRAM periphery circuit is selected from the group consisting of:
    an SRAM bit-line pre-charge circuit;
    an SRAM timing circuit;
    an SRAM read circuit; and
    an SRAM write circuit.

11. The integrated circuit as recited in claim 9 wherein switching the at least one SRAM periphery circuit is based on maintaining a static noise margin figure of merit for the SRAM array.

12. The integrated circuit as recited in claim 9 wherein the digital core voltage is scaled independently of the SRAM array voltage.

* * * * *